(12) United States Patent
Bu et al.

(10) Patent No.: US 8,004,032 B1
(45) Date of Patent: Aug. 23, 2011

(54) SYSTEM AND METHOD FOR PROVIDING LOW VOLTAGE HIGH DENSITY MULTI-BIT STORAGE FLASH MEMORY

(75) Inventors: Jiankang Bu, Windham, ME (US); Lee James Jacobson, Cape Elizabeth, ME (US); Andre Paul Labonte, Lewiston, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 674 days.

(21) Appl. No.: 11/437,564

(22) Filed: May 19, 2006

(51) Int. Cl.
*H01L 29/788* (2006.01)
(52) U.S. Cl. ............ 257/315; 257/317; 257/E29.3
(58) Field of Classification Search .......... 257/315–317, 257/321, E29.3
See application file for complete search history.

(56) References Cited

U.S. PATENT DOCUMENTS

| | | | |
|---|---|---|---|
| 6,268,622 B1 * | 7/2001 | Shone et al. | 257/314 |
| 6,566,707 B1 * | 5/2003 | Sudo et al. | 257/316 |
| 7,015,102 B2 * | 3/2006 | Wang | 438/259 |
| 7,242,051 B2 * | 7/2007 | Widjaja et al. | 257/316 |
| 2006/0001077 A1 * | 1/2006 | Ryu et al. | 257/315 |

OTHER PUBLICATIONS

David Sowards, "Non-Volatile Memory: The principles, the technologies, and their significance to the smart card integrated circuit," 1999 Emosyn and Silicon Storage Technology, pp. 1-13.

* cited by examiner

*Primary Examiner* — Tuan N. Quach (57) ABSTRACT

A system and method is disclosed for providing a low voltage high density multi-bit storage flash memory. A dual bit memory cell of the invention comprises a substrate having a common source, a first drain and first channel, and a second drain and a second channel. A common control gate is located above the source. A first floating gate and a second floating gate are located on opposite sides of the control gate. Each floating gate is formed with a sharp tip adjacent to the control gate and an upper curved surface that follows a contour of the surface of the control gate. The sharp tips of the floating gates efficiently discharge electrons into the control gate when the memory cell is erased. The curved surfaces increase capacitor coupling between the control gate and the floating gates.

22 Claims, 9 Drawing Sheets

SYSTEM AND METHOD FOR PROVIDING LOW VOLTAGE HIGH DENSITY MULTI-BIT STORAGE FLASH MEMORY

TECHNICAL FIELD OF THE INVENTION

The present invention is generally directed to the manufacture of integrated circuits and, in particular, to a system and method for providing low voltage high density multi-bit storage flash memory for an electrically erasable programmable read only memory (EEPROM) device.

CROSS REFERENCE TO RELATED APPLICATION

This patent application is related to U.S. patent application Ser. No. 10/726,122 entitled "Method of Forming a Sub-Micron Tip Feature" filed on Dec. 2, 2003, U.S. Pat. No. 7,175,777.

BACKGROUND OF THE INVENTION

A fundamental design challenge in creating a memory cell of an electrically erasable programmable read only memory (EEPROM) device is to use a controllable and reproducible electrical effect that has sufficient non-linearity so that the memory cell (1) can be written to (or erased) at one voltage in less than one millisecond (1 ms) and can be read at another voltage, and (2) the data within the memory cell must remain unchanged for more than ten (10) years.

Prior art stacked/split gate EEPROM technology requires (1) special multi-polysilicon materials, (2) different gate oxide thicknesses, and (3) modified doping profiles. These prior art requirements create process complexity and high cost when embedded into a complementary metal oxide semiconductor (CMOS) process.

Figure 1:
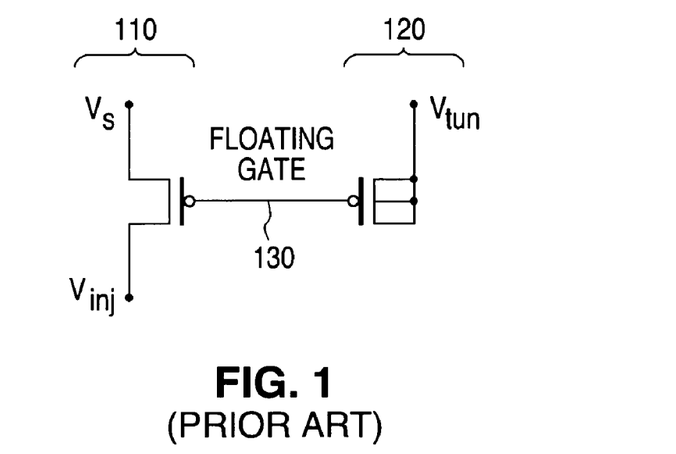
FIG. 1 illustrates a schematic representation of a prior art memory cell of a single poly erasable programmable read only memory (EEPROM) device.
Figure 2:
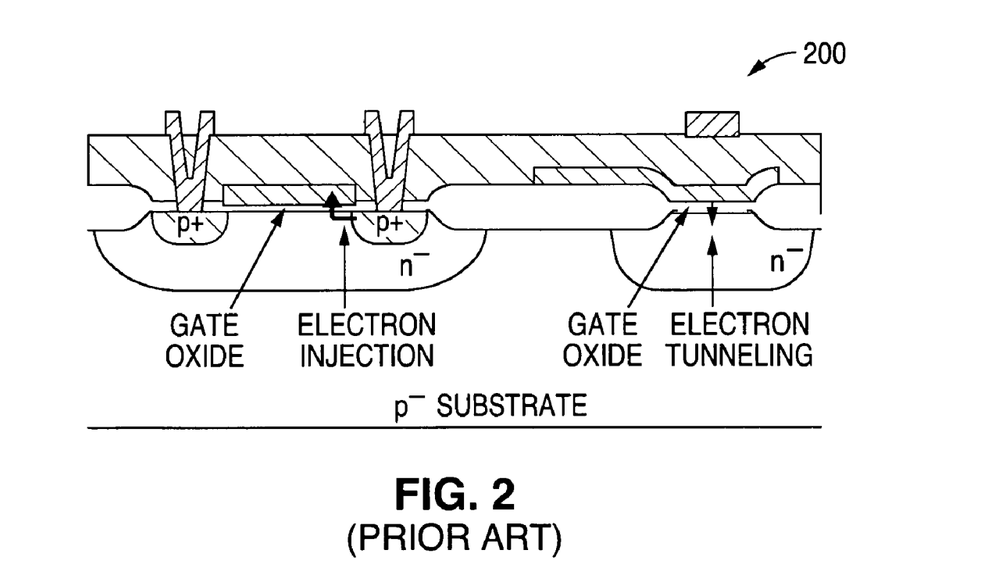
FIG. 2 illustrates a cross sectional view of the prior art memory cell schematically represented in FIG. 1.

FIG. 1 illustrates a schematic diagram of a prior art memory cell 100 of a single poly erasable programmable read only memory (EEPROM) device. Memory cell 100 comprises one P-channel metal oxide semiconductor (PMOS) transistor 110 and one P-channel metal oxide semiconductor (PMOS) capacitor 120. The PMOS capacitor 120 is formed by connecting together the source, drain and substrate of a PMOS transistor. A cross sectional view 200 of the memory cell 100 is shown in FIG. 2.

The PMOS transistor 110 may be referred to as PMOS program transistor 110. The PMOS capacitor 120 may be referred to as PMOS control capacitor 120. The gate of the PMOS program transistor 110 and the gate of the PMOS control capacitor 120 are connected together (i.e., shorted together) and are isolated from the other active elements. The shorted gates of the PMOS program transistor 110 and the PMOS control capacitor 120 are collectively referred to as a "floating gate" 130. Charges (in amounts that represent either a zero (0) representation or a one (1) representation) may be written to the floating gate 130. In order to avoid well bias interference, the PMOS program transistor 110 and the PMOS control capacitor 120 are each located in a separate N well.

The prior art memory cell 100 is written to by injecting drain avalanche hot electrons into the floating gate 130. For PMOS operation (as shown in FIG. 1 and in FIG. 2) low voltage is applied to the control gate and drain of PMOS control capacitor 120 and high voltage is applied to the source/well of PMOS program transistor 110. The channel of PMOS program transistor 110 is turned on and hot electrons are generated at the high electric field region at the drain junction (designated "$V_{inj}$" in FIG. 1). With positive voltage on the control gate of PMOS control transistor 120, some hot electrons with high energy will pass through the silicon-silicon dioxide (Si—$SiO_2$) potential barrier and be injected into the floating gate 130.

The prior art memory cell 100 is erased by applying a high voltage to the control gate of the PMOS control transistor 120 and by grounding the drain and source of the PMOS program transistor 110. Electrons on the floating gate 130 will pass through the gate oxide between the floating gate 130 and the control gate of the PMOS control capacitor 120 by Fowler-Nordheim (FN) tunneling process and go to the substrate.

During programming, most control gate voltage should be coupled between the floating gate 130 and the drain/source of the PMOS program transistor 110 to facilitate electron injection to the floating gate 130 but not further to the control gate of the PMOS control transistor 120. This requires the capacitance between the floating gate 130 and the control gate to be large. On the other hand, during the erase procedure, more control gate voltage should be coupled between the floating gate 130 and the control gate, so that electrons can tunnel from the floating gate 130 to the substrate by the Fowler-Nordheim (FN) tunneling process. This requires the capacitance between the floating gate 130 and the control gate to be small.

These two contradictory requirements for the control gate capacitance during the program procedure and the erase procedure leave a narrower operation window. This results in poor data retention and slower speeds for an EEPROM that comprises one PMOS program transistor and one PMOS control capacitor.

To improve the operational speed and data retention for a single poly EEPROM device, EEPROM designers have sometimes placed an additional capacitor in the basic memory cell. This approach has one large capacitor for the programming operation and one small capacitor for the erase operation. Capacitor coupling techniques are used to achieve a favorable electric field for both the programming operation and the erase operation.

The floating gate of an added capacitor has to be filled with hot electrons. Hot electrons that pass through gate oxide will create oxide damage. Oxide damage degrades the endurance of a memory cell. Endurance is measured by how many program/erase cycles the gate oxide can tolerate before unacceptable damage occurs. Therefore, one major drawback to adding an extra capacitor is that it degrades EEPROM memory cell endurance performance.

Another drawback to adding an extra capacitor is that it significantly increases the size of the basic memory cell. This significantly lowers the EEPROM density. Additional chip area is required for the extra capacitors. This increases the cost.

Another drawback of prior art CMOS EEPROM technology is the speed of the programming procedure. The programming procedure is carried out by utilizing drain avalanche hot electrons. Because the efficiency of generating and injecting the drain avalanche hot electrons is low, programming times are relatively long. The programming time is usually one hundred milliseconds (100 ms) or longer. Even the improved coupling provided by using additional capacitors only reduces the programming time to about twenty milliseconds (20 ms).

To improve the operational speed and data retention for the memory cells of EEPROM devices, EEPROM designers have developed approaches that rely on a technique that is referred to as "Source-Side (channel hot electron) Injection" ("SSI"). An example of this approach is a split gate, floating gate memory cell developed and patented by Silicon Storage Technology, Inc. called SST CMOS SuperFlash™ EEPROM Cell. SuperFlash™ is a trademark of Silicon Storage Technology, Inc.

Figure 3:
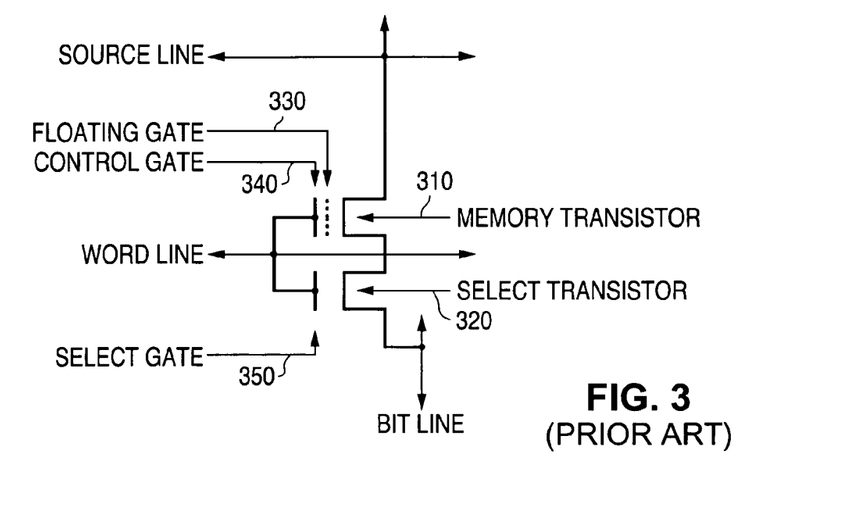
FIG. 3 illustrates a schematic representation of a prior art SST CMOS SuperFlash™ EEPROM memory cell.

A schematic representation of the prior art SST CMOS SuperFlash™ EEPROM Cell 300 is shown in FIG. 3. The memory cell 300 comprises a memory transistor 310 and a select transistor 320. The gate of the memory transistor 310 comprises a floating gate 330 and a control gate 340. The gate of the select transistor 320 comprises a select gate 350. The control gate 340 and the select gate 350 are in fact one and the same in a "split" gate configuration.

The channel of the memory transistor 310 (and hence the current through it) is controlled by the combination of the floating gate 330 and the control gate 340. Depending upon the amount of charge that is stored on the floating gate 330, the memory transistor 310 is in either a high threshold state or a low threshold state.

Figure 4:
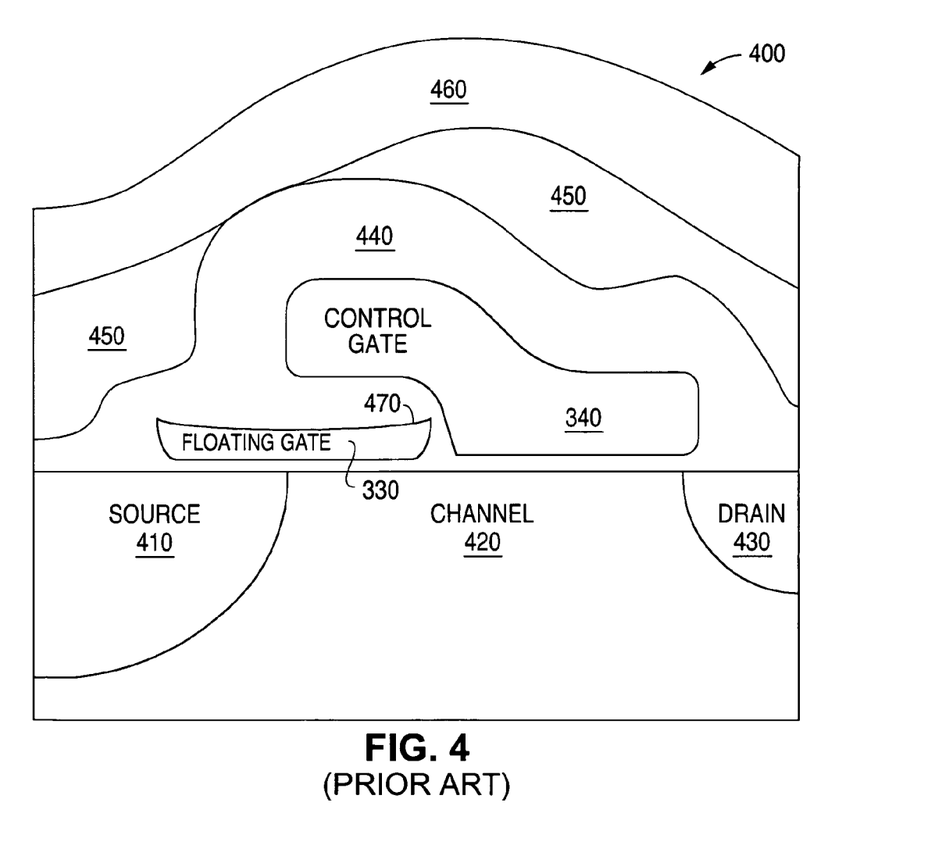
FIG. 4 illustrates a schematic representation of a cross section of a memory transistor of the prior art memory cell schematically represented in FIG. 3.

FIG. 4 shows a schematic representation of a cross section 400 of the memory transistor 310 along the bit line direction. FIG. 4 is taken from a scanning electron microscope (SEM) micrograph of a cross section of memory transistor 310. The memory transistor 310 comprises source 410, channel 420 and drain 430.

The floating gate 330 is formed of a first layer of polysilicon (referred to as "Poly 1"). The control gate 340 is formed of a second layer of polysilicon (referred to as "Poly 2"). The floating gate 330 and the control gate 340 are covered with a gate oxide 440. The gate oxide 440 is covered with another oxide layer 450, which in turn is covered with yet another oxide layer 460.

The floating gate 330 is separated from the source 410 and from the channel 420 by approximately one hundred fifty Ångstroms (150 Å) of gate oxide 440. The control gate 340 is separated from the channel 420 by approximately four hundred Ångstroms (400 Å) of gate oxide 440. The end of the floating gate 330 nearest to the control gate 340 is separated from the sidewall of the control gate 340 by approximately 400 hundred Ångstroms (400 Å) of gate oxide 440. The top of the floating gate 330 is separated from the control gate 340 in the vertical direction by approximately two thousand Ångstroms (2000 Å) of gate oxide 440. A tunneling injector 470 is formed on the edge of the first layer of polysilicon ("Poly 1") of floating gate 330.

The memory cell 300 that comprises memory transistor 310 and select transistor 320 erases by using Fowler-Nordheim ("FN") tunneling from floating gate 330 to control gate 340. The floating gate poly oxidation process provides a uniform field enhanced tunneling injector along the edges of the floating gate 330. This is a key feature of the SST CMOS SuperFlash™ EEPROM Cell 300. The presence of the corner enhanced electric field decreases the voltage that is required to perform the erase function.

For example, during the erase procedure, the source 410 and the drain 430 are grounded and the voltage on the control gate 340 is increased to about fifteen volts (15 V). The low coupling ratio between the control gate 340 and the floating gate 330 provides a significant voltage across the interpoly gate oxide 440 between the Poly 1 of the floating gate 330 and the Poly 2 of the control gate 340. A local high electric field is generated primarily along the edge of the tunneling injector 470.

Charge transfer occurs between the control gate 340 and the floating gate 330. The charge transfer is eventually limited by the accumulation of positive charge on the floating gate 330. That is, the positive charge on the floating gate 330 increases the floating gate voltage until there is insufficient voltage across the interpoly gate oxide 440 to sustain Fowler-Nordheim tunneling.

The removal of negative charge from the floating gate 330 leaves a net positive charge on the floating gate 330. The resulting positive charge on the floating gate 330 decreases the threshold voltage of the memory cell 300 so that the memory cell 300 will conduct during a read and give a value of one ("1"). In this manner the memory cell 300 is programmed using a high efficiency Source-Side (channel hot electron) Injection ("SSI").

During the programming procedure, a voltage that is approximately equal to the threshold voltage ("Vt") of the select transistor 320 is placed on the control gate 340. This is sufficient to turn on the channel 420 under the select portion of the control gate 340. The drain 430 is held to the Vss voltage (the ground voltage) if the memory cell 300 is to be programmed. The drain 430 is held to the Vdd voltage (the power supply voltage) is the memory cell 300 is inhibited from being programmed.

The drain voltage (i.e., the voltage at drain 430) is transferred across the select channel because of the voltage on the control gate 340. The source voltage (i.e., the voltage at source 410) is held to twelve volts (12 V). The source to drain voltage differential generates hot channel electrons. The source voltage is capacitatively coupled to the floating gate 330. The electric field between the floating gate 330 and the channel 420 sweeps the channel hot electrons that cross the silicon-silicon dioxide ($Si$—$SiO_2$) barrier of three and two tenths electron volts (3.2 eV) to the floating gate 330.

The structure of memory cell 300 has several major drawbacks. One drawback is that in order to get a sufficiently high coupling from the source 410 to the floating gate 330 during the programming procedure, the lateral extent of the source 410 must have a significant amount of overlap with the floating gate 330. Furthermore, the source 410 must be deep enough to tolerate the high voltage that must be applied (typically, twelve volts (12 V) as previously mentioned).

The lateral extent of the significant overlap of the source 410 with the floating gate 330 is shown in FIG. 4. The requirement a large source 410, the size of the overlap between the source 410 and the floating gate 330, and the size of the channel 420 under the control gate 340 make the size of the bitcell greater than thirteen square units of feature size (13 $F^2$). A typical feature size (F) may be thirty five hundredths of a micron (0.35 μm).

Another drawback is that the fabrication process for the memory cell 300 is complicated. The fabrication process for the memory cell 300 requires the creation of a special injector profile for the tunneling injector 470 and a very thick layer (approximately 2000 Å) of interpoly gate oxide 440 on top of the floating gate 330. Furthermore, a buried high voltage drain 430 is required that is not self-aligned to the floating gate 330. A relatively thick layer of gate oxide 440 (approximately 150 Å) must be formed under the floating gate 330 to separate the floating gate 330 from the source 410 and the channel 420. Lastly, a relatively thick layer of gate oxide 440 (approximately 400 Å) must be formed under the control gate 340 to separate the control gate 340 from the channel 420.

Therefore, there is a need in the art for an improved system and method for providing an improved high density electrically erasable programmable read only memory (EEPROM) device. In particular, there is a need in the art for an improved system and method for providing low voltage high density multi-bit storage flash memory for an electrically erasable programmable read only memory (EEPROM) device.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 5 through 23, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged electrically erasable programmable read only memory (EEPROM) device.

Figure 5:
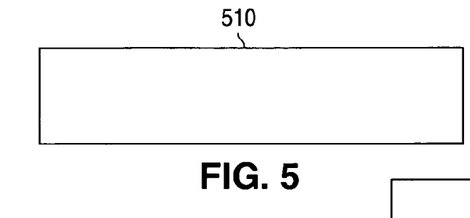
FIGS. 5 through 12 illustrate successive stages in the manufacture of a memory cell constructed in accordance with the principles of the present invention.

FIGS. 5 through 12 illustrate successive stages in the manufacture of a low voltage high density multi-bit storage flash memory cell constructed in accordance with the principles of the present invention. In the first step of the manufacturing method of the memory cell of the present invention a silicon substrate 510 is deposited on a handle wafer (not shown). The silicon substrate 510 is shown in FIG. 5. In an advantageous embodiment of the invention the thickness of the silicon substrate 510 is approximately one and two tenths millimeters (1.2 mm).

Figure 6:
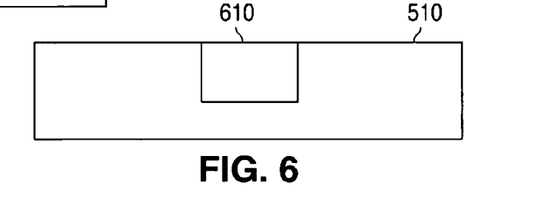

Using a mask, etch and implant procedure the silicon substrate 510 is implanted with a suitable dopant to create a source 610 for the memory cell. The source 610 of the memory cell is shown in FIG. 6. In an advantageous embodiment of the invention (for a 0.35 µm technology) the depth of the source 610 is approximately three tenths of a micron (0.3 µm) and the width of the source 610 is approximately seven tenths of a micron (0.7 µm). As will be more fully described, the source 610 will be a common source for each of two bits of the memory cell of the invention.

Figure 7:
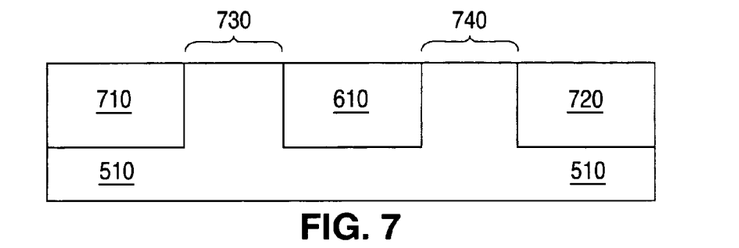

In the next step of the manufacturing method of the memory cell of the invention a mask, etch and implant procedure is performed to form a first drain 710 and a second drain 720 in the silicon substrate 510. The silicon substrate 510 is implanted with a suitable dopant to create the first drain 710 and the second drain 720. The first drain 710 and the second drain 720 of the memory cell are shown in FIG. 7. In an advantageous embodiment of the invention (for a 0.35 µm technology) the depth of first drain 710 and the depth of the second drain 720 is approximately three tenths of a micron (0.3 µm) and the width of the first drain 710 and the width of the second drain 720 is approximately thirty five hundredths of a micron (0.35 µm).

The portion of the substrate 510 that is located between the source 610 and the first drain 710 comprises a first channel 730. The portion of the substrate 510 that is located between the source 610 and the second drain 720 comprises a second channel 740. The first channel 730 and the second channel 740 of the memory cell is also shown in FIG. 7. In an advantageous embodiment of the invention (for a 0.35 µm technology) the width of first channel 730 and the width of the second channel 740 is approximately thirty five hundredths of a microns (0.35 µm).

Figure 8:
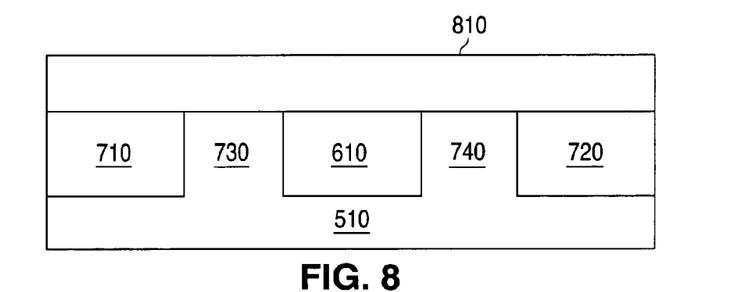

In the next step of the manufacturing method of the memory cell of the invention a first oxide layer 810 (e.g., silicon oxide) is deposited over the first drain 710, the first channel 730, the source 610, the second channel 740 and the second drain 720. The first oxide layer 810 is shown in FIG. 8. In an advantageous embodiment of the invention the thickness of the first oxide layer 810 is approximately two hundred Ångstroms (200 Å).

Figure 9:
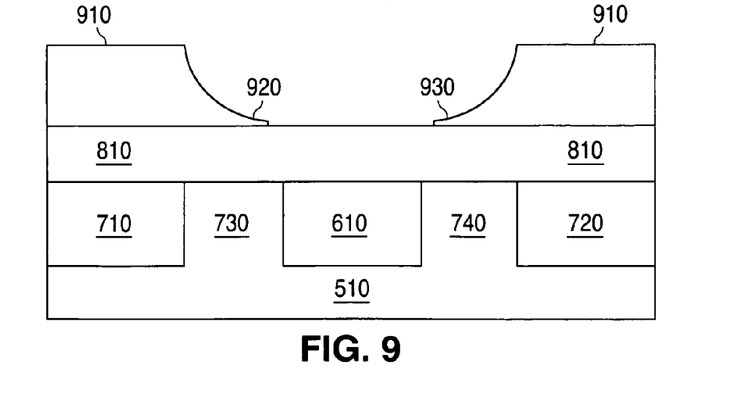

In the next step of the manufacturing method of the memory cell of the invention a first layer of polysilicon 910

("Poly1" 910) is deposited on the first oxide layer 810. In an advantageous embodiment of the invention the thickness of the first layer of polysilicon 910 is approximately two tenths of a micron (0.2 μm). Then a mask and etch procedure is performed to etch a specially shaped aperture in the first layer of polysilicon 910.

The first layer of polysilicon 910 is etched using the "Sub-Micron Tip Method" that is set forth and described in U.S. patent application Ser. No. 10/726,122 entitled "Method of Forming a Sub-Micron Tip Feature" filed on Dec. 2, 2003. The text of U.S. patent application Ser. No. 10/726,122 is incorporated by reference into this patent document.

Application of the "Sub-Micron Tip Method" etches the first layer of polysilicon 910 to form a sharp tip 920 that points from the left side of the first layer of polysilicon 910 toward the center of the memory cell. Similarly, application of the "Sub-Micron Tip Method" etches the first layer of polysilicon 910 to form a sharp tip 930 that points from the right side of the first layer of polysilicon 910 toward the center of the memory cell. The structure of the sharp tip 920 and the structure of the sharp tip 930 are shown in FIG. 9.

Figure 10:
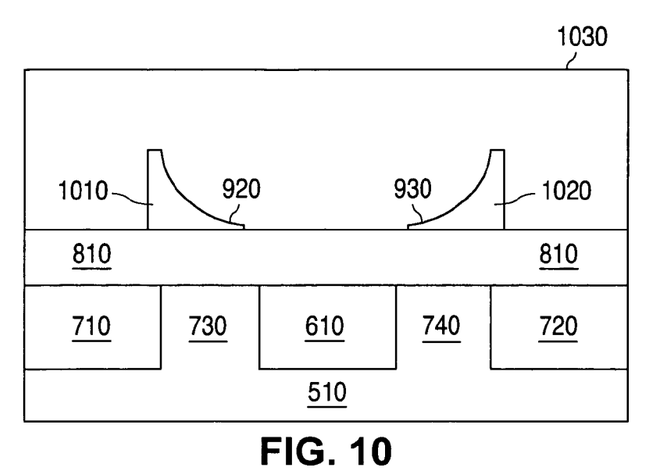

In the next step of the manufacturing method of the memory cell of the invention the outer portions of the first layer of polysilicon 910 ("Poly1" 910) are etched away to form a first floating gate 1010 and a second floating gate 1020. The first floating gate 1010 and the second floating gate 1020 are shown in FIG. 10. The right side (i.e., the innermost side) of the first floating gate 1010 in FIG. 10 comprises the sharp tip 920. The left side (i.e., the innermost side) of the second floating gate 1020 in FIG. 10 comprises the sharp tip 930.

In the next step of the manufacturing method of the memory cell of the invention the first floating gate 1010 and the second floating gate 1020 and the first oxide layer 810 are covered with a second oxide layer 1030 (e.g., silicon oxide). The second oxide layer 1030 is shown in FIG. 10. In an advantageous embodiment of the invention (for a 0.35 μm technology) the thickness of the second oxide layer 1030 is approximately five tenths of a micron (0.5 μm) to six tenths of a micron (0.6 μm).

Figure 11:
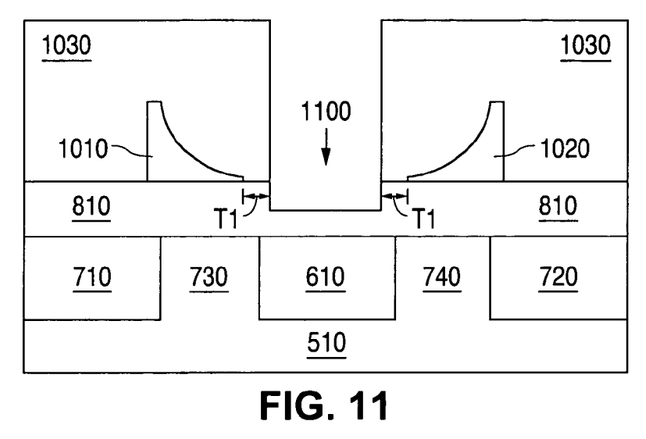

In the next step of the manufacturing method of the memory cell of the invention portions of the second oxide layer 1030 are etched away and portions of the first oxide layer 810 are etched away. The etching procedure forms a first aperture 1100 through the second oxide layer 1030 and through the top portion of the first oxide layer 810. The shape of the first aperture 1100 is shown in FIG. 11. The bottom portion of the first aperture 1100 comprises a centrally located trench through the top portion of the first oxide layer 810.

As shown in FIG. 11, the dimensions of the first aperture 1100 are selected so that the thickness of the oxide material between the first aperture 1100 and the sharp tip of the first floating gate 1010 (and between the first aperture 1100 and the sharp tip of the second floating gate 1020) has a selected value (designated T1). In an advantageous embodiment of the invention (for a 0.35 μm technology) the thickness T1 of the oxide material is approximately one hundred fifty Ångstroms (150 Å) or equivalently, fifteen thousandths of a micron (0.015 μm).

Figure 12:
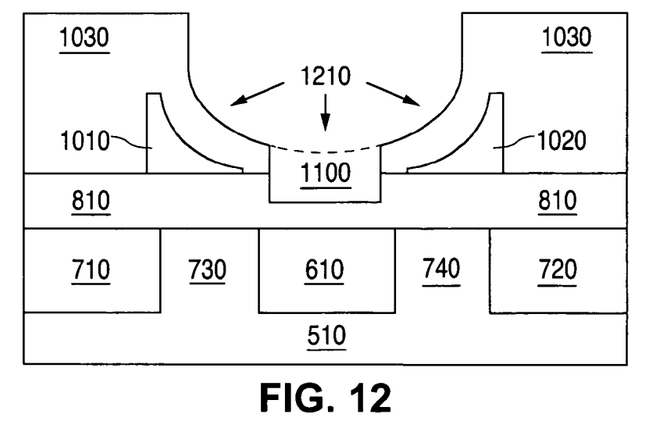

In the next step of the manufacturing method of the memory cell of the invention portions of the second oxide layer 1030 are etched away. The etching procedure forms a second aperture 1210 in the second oxide layer 1030. The shape of the second aperture 1210 is shown in FIG. 12. The second aperture 1210 is located above the first aperture 1100.

The walls of the second oxide layer 1030 that form the second aperture 1210 comprise a first curved surface that follows the contour of the curved surface of the first floating gate 1010. The walls of the second oxide layer 1030 that form the second aperture 1210 also comprise a second curved surface that follows the contour of the curved surface of the second floating gate 1020.

Figure 13:
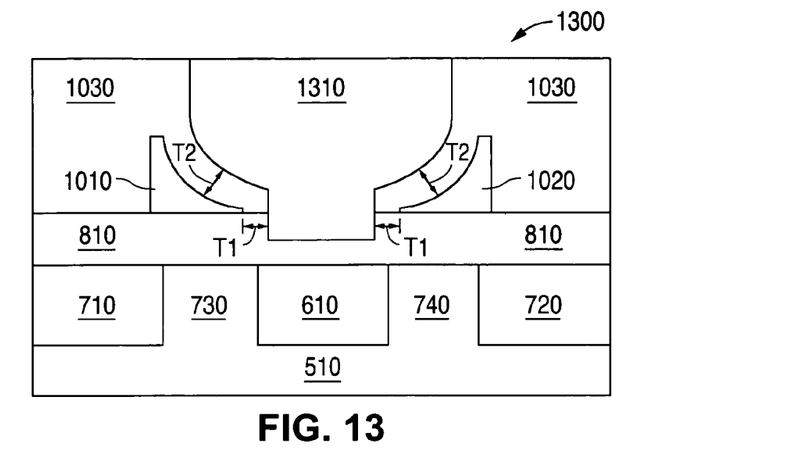
FIG. 13 illustrates an advantageous structure of the memory cell of the present invention showing the close conformity of a curved surface of a first floating gate and a curved surface of a second floating gate to the curved surfaces of the control gate of the memory cell.

As shown in FIG. 13, the dimensions of the second aperture 1210 are selected so that the thickness of the oxide material between the second aperture 1210 and the curved surface of the first floating gate 1010 (and between the second aperture 1210 and the curved surface of the second floating gate 1020) has a selected value (designated T2). In an advantageous embodiment of the invention (for a 0.35 μm technology) the thickness T2 of the oxide material is approximately three hundred Ångstroms (300 Å), or equivalently, three hundredths of a micron (0.03 μm).

In the next step of the manufacturing method of the memory cell of the invention a second layer of polysilicon 1310 ("Poly2" 1310) is deposited to fill the first aperture 1100 and the second aperture 1210. The second layer of polysilicon 1310 forms a control gate 1310 of the memory cell. As will be more fully described, the control gate 1310 will be a common control gate for each of two bits of the memory cell of the invention. The completed memory cell 1300 is shown in FIG. 13.

The first bit of the memory cell 1300 ("Bit 1") is stored in that portion of the memory cell 1300 that comprises common source 610, first channel 730, first drain 710, first floating gate 1010 and common control gate 1310. The second bit of the memory cell 1300 ("Bit 2") is stored in that portion of the memory cell 1300 that comprises common source 610, second channel 740, second drain 720, second floating gate 1020 and common control gate 1310.

The geometry of the elements of the memory cell 1300 of the invention is a very important feature of the invention. As previously mentioned, the curvature of the upper portion of the control gate 1310 follows the contour of the curved surface of the first floating gate 1010 and follows the contour of the curved surface of the second floating gate 1020. This feature is illustrated by the double arrows shown in FIG. 13. In an advantageous embodiment of the memory cell 1300 of the invention the thickness of the second oxide layer 1030 between the curved surface of control gate 1310 and the curved surface of the first floating gate 1010 is approximately three hundredths of a micron (0.03 μm). Similarly, the thickness of the second oxide layer 1030 between the curved surface of control gate 1310 and the curved surface of the second floating gate 1020 is approximately three hundredths of a micron (0.03 μm).

The close conformity of the curved surface of the control gate 1310 to the curved surface of the first floating gate 1010 enhances the capacitor coupling between the Poly2 polysilicon of the control gate 1310 and the Poly1 polysilicon of the first floating gate 1010. Similarly, the close conformity of the curved surface of the control gate 1310 to the curved surface of the second floating gate 1020 enhances the capacitor coupling between the Poly2 polysilicon of the control gate 1310 and the Poly1 polysilicon of the second floating gate 1020. This feature improves hot electron injection efficiency. This means that lower voltages on the control gate 1310 may be used during the programming operation to attract a given number of hot electrons to the first floating gate 1010 and to the second floating gate 1020.

During read operations the read voltage that is applied to the control gate 1310 may also be reduced for the same reason (i.e., increased hot electron injection efficiency due to increased capacitor coupling between the Poly1 silicon layer and the Poly2 silicon layer).

Another important feature of the memory cell 1300 of the invention is that two different etch procedures are used to determine the thickness T1 of the oxide material between the control gate 1310 and the sharp tips (920, 930) of the floating gates (1010, 1020) and the thickness T2 of the oxide material between the control gate 1310 and curved upper surfaces of the floating gates (1010, 1020). That is, the etch procedures for forming the two thicknesses T1 and T2 are decoupled.

This means that separate values of the two thicknesses T1 and T2 can be selected for optimum operation of the memory cell 1300. Specifically, the thickness T1 is selected to be thick enough to guarantee retention of the electric charges that are placed on the floating gates (1010, 1020) but thin enough to allow a reasonable erase voltage to erase the floating gates (1010, 1020) (i.e., by discharging electrons into the control gate 1310).

The value of the thickness T2 is larger than the thickness T1. The larger value of thickness for thickness T2 improves the reliability of the retention of the electric charges on the floating gates (1010, 1020) while allowing the thickness T1 to be thin enough to allow a lower value of erase voltage to erase the bits in the memory cell 1300. The ability to separately adjust the values of thickness T1 and thickness T2 in memory cell 1300 is a valuable feature.

Figure 14:
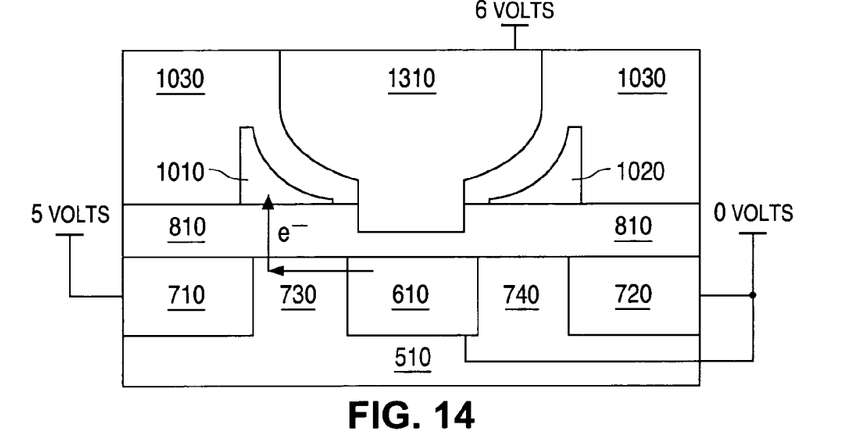
FIG. 14 illustrates an operation of the memory cell of the present invention showing a programming procedure for the first bit of the memory cell.

FIG. 14 illustrates how the first bit ("Bit 1") of the memory cell 1300 of the present invention may be programmed. As shown in FIG. 14, the common source 610 and the second drain 720 are grounded (i.e. coupled to zero volts (0 V)). A medium high voltage (e.g., five volts (5 V) for a 0.25 micron process) is applied to the first drain 710 and a slightly higher medium high voltage (e.g., six volts (6 V) for a 0.25 micron process) is applied to the control gate 1310.

The difference in voltage between the control gate 1310 and the first drain 710 causes electrons to flow through the first channel 730. This places the first channel 730 under the first floating gate 1010 is in an "on" condition. Channel hot electrons are generated near the edge of the first drain 710 and are injected into the first floating gate 1010. The electrons charge up the first floating gate 1010. This stores a logical "one" in the first floating gate 1010.

Figure 15:
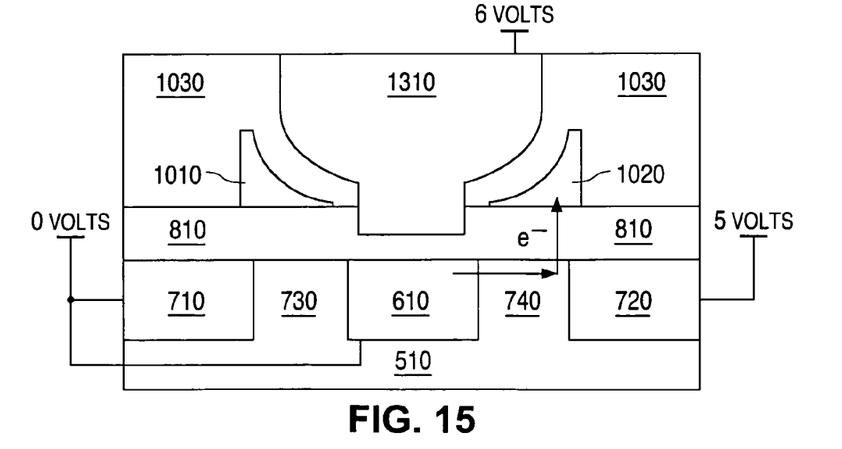
FIG. 15 illustrates an operation of the memory cell of the present invention showing a programming procedure for the second bit of the memory cell.

FIG. 15 illustrates how the second bit ("Bit 2") of the memory cell 1300 of the present invention may be programmed. As shown in FIG. 15, the common source 610 and the first drain 710 are grounded (i.e. coupled to zero volts (0 V)). A medium high voltage (e.g., five volts (5 V) for a 0.25 micron process) is applied to the second drain 720 and a slightly higher medium high voltage (e.g., six volts (6 V) for a 0.25 micron process) is applied to the control gate 1310.

The difference in voltage between the control gate 1310 and the second drain 720 causes electrons to flow through the second channel 740. This places the second channel 740 under the second floating gate 1020 is in an "on" condition. Channel hot electrons are generated near the edge of the second drain 720 and are injected into the second floating gate 1020. The electrons charge up the second floating gate 1020. This stores a logical "one" in the second floating gate 1010.

Figure 16:
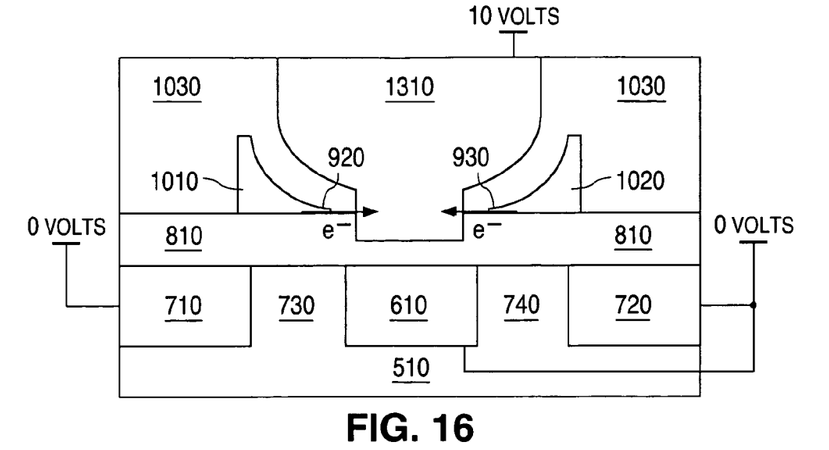
FIG. 16 illustrates an operation of the memory cell of the present invention showing an erase procedure for the first and second bits of the memory cell.

FIG. 16 illustrates how the first bit ("Bit 1") and the second bit ("Bit 2") of the memory cell 1300 of the present invention may be erased. As shown in FIG. 16, the common source 610 and the first drain 710 and the second drain 720 are grounded (i.e. coupled to zero volts (0 V)). A relatively high voltage (e.g., ten volts (10 V) for a 0.25 micron process) is applied to the control gate 1310. The relatively high control gate voltage generates an electric field that discharges the electrons from the first floating gate 1010 and the second floating gate 1020 to the control gate 1310.

The geometry of the sharp tip 920 of the first floating gate 1010 creates an enhanced electric field strength that discharges the electrons from the first floating gate 1010 to the control gate 1310. Similarly, the geometry of the sharp tip 930 of the second floating gate 1020 creates an enhanced electric field strength that discharges the electrons from the second floating gate 1020 to the control gate 1310.

Sharp tip 920 and sharp tip 930 can be made very sharp. The sharper the tips of sharp tip 920 and sharp tip 930 are, the lower is the control gate voltage that is required to perform the erase procedure. Increasing the sharpness of sharp tip 920 and of sharp tip 930 decreases the level of control gate voltage that is required to perform the erase procedure by increasing the sharp corner enhanced Fowler-Nordheim (FN) tunneling.

The sharp tips (920 and 930) face each other. This feature allows a common source (i.e., common source 610) to be placed between the two bits ("Bit 1" and "Bit 2") of the memory cell 1300 of the invention. Common source 610 can then be used as the common source for both bits ("Bit 1" and "Bit 2") of the memory cell 1300 of the invention. This arrangement simplifies the array design of the memory cells, reduces memory cell size and decreases the manufacturing costs.

Furthermore, the arrangement in which the sharp tips (920 and 930) face each other also allows a common control gate (i.e., control gate 1310) to be placed between the two bits ("Bit 1" and "Bit 2") of the memory cell 1300 of the invention with minimal effort and cost. This arrangement further facilitates memory array design because the two bits ("Bit 1" and "Bit 2") of the memory cell 1300 can both be erased simultaneously by applying a voltage to the control gate 1310.

Figure 17:
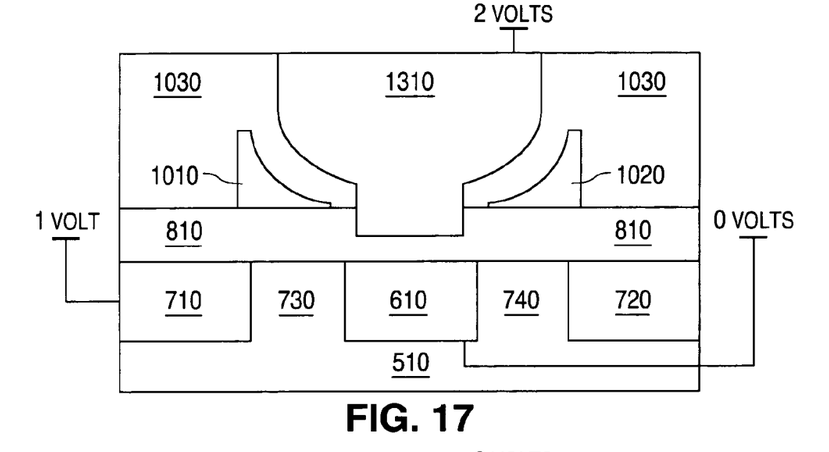
FIG. 17 illustrates an operation of the memory cell of the present invention showing a read procedure for the first bit of the memory cell.

FIG. 17 illustrates how the first bit ("Bit 1") of the memory cell 1300 of the present invention may be read. As shown in FIG. 17, the common source 610 is grounded (i.e., coupled to zero volts (0 V)). A low voltage (e.g., one volt (1 V) for a 0.25 micron process) is applied to the first drain 710. A slightly higher read voltage (e.g., two volts (2 V) for a 0.25 micron process) is applied to the control gate 1310.

If the first floating gate 1010 is charged with electrons, then the first channel 730 will be in an "off" condition and the first bit ("Bit 1") will be read as a "zero" or "off" state. If the first floating gate 1010 is in a discharged state, then the first channel 730 will be in an "on" condition and the first bit ("Bit 1") will be read as a "one" or "on" state.

Figure 18:
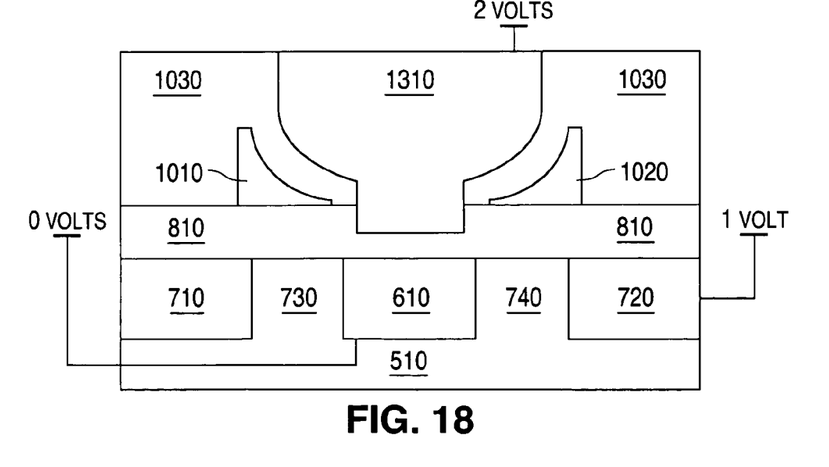
FIG. 18 illustrates an operation of the memory cell of the present invention showing a read procedure for the second bit of the memory cell.

Similarly, as shown in FIG. 18, the second bit ("Bit 2") of the memory cell 1300 can be read by applying the low voltage (e.g., one volt (1 V) for a 0.25 micron process) to the second drain 720 and applying the read voltage (e.g., two volts (2 V) for a 0.25 micron process) to the control gate 1310. The common source 610 is grounded (i.e., coupled to zero volts (0 V)). By selectively applying a drain bias voltage to the first drain 710 or to the second drain 720, one can selectively read the first bit ("Bit 1") and the second bit ("Bit") of the memory cell 1300.

The memory cell 1300 of the present invention can store four (4) different memory states. The first memory state is Memory State Zero ("0") in Bit 1. The second memory state is Memory State One ("1") in Bit 1. The third memory state is Memory State Zero ("0") in Bit 2. The fourth memory state is Memory State One ("1") in Bit 2.

Figure 19:
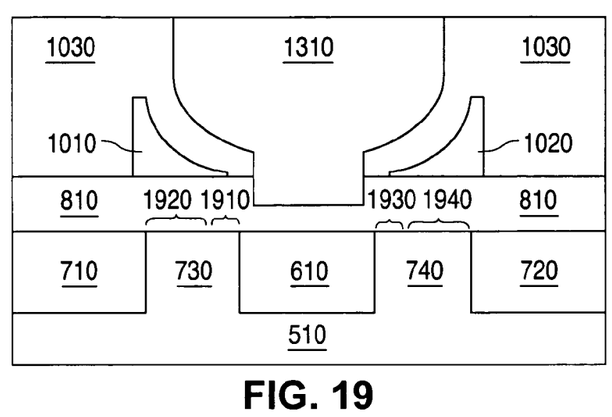
FIG. 19 illustrates that the memory cell of the present invention has two different levels of threshold voltage in each of the two channels of the memory cell.

FIG. 19 illustrates another advantageous feature of the present invention. As shown in FIG. 19, the geometry of the polysilicon of the first floating gate 1010 (1) creates a higher threshold voltage in the channel area 1910 that is close to the common source 610, and (2) creates a lower threshold voltage in the channel area 1920 that is close to the first drain 710.

This feature provides a built-in select transistor that avoids over-erase problems that occur in other types of memory cells. In some prior art memory cells an over-erase problem occurs when too much positive charge accumulates on the floating gate. This may make the threshold voltage (Vth) negative (i.e. less than zero) and lead to high leakage even when the control gate voltage is zero.

In the memory cell 1300 of the present invention the value of the threshold voltage (Vth) in the channel area 1910 that is close to the common source 610 is higher than in the other portion of the channel area 1920 that is close to the first drain 710. That is, the channel area 1910 has a relatively high threshold voltage value (e.g., one and one half volts (1.5 V)) and the channel area 1920 has a relatively low threshold voltage value (e.g., one volt (1.0 V)). This is due to the geometry of the polysilicon of the first floating gate 1010.

The different threshold voltage values in the channel 730 provide the function of a select transistor. In some prior art memory cells an extra transistor is added to the memory cell to serve as the select transistor. The presence of an additional select transistor increases the size of the memory cell.

Similarly, the geometry of the polysilicon of the second floating gate 1020 (1) creates a higher threshold voltage in the channel area 1930 that is close to the common source 610, and (2) creates a lower threshold voltage in the channel area 1940 that is close to the second drain 720. The remarks made above with respect to the channel areas 1910 and 1920 of first channel 730 also pertain to the corresponding channel areas 1930 and 1940 of the second channel 740. Specifically, the channel area 1930 has a relatively high threshold voltage value (e.g., one and one half volts (1.5 V)) and the channel area 1940 has a relatively low threshold voltage value (e.g., one volt (1.0 V)).

As described in U.S. patent application Ser. No. 10/726, 122 the "Sub-Micron Tip Method" causes the sharp tip 920 of the first floating gate 1010 and the sharp tip 930 of the second floating gate 1020 to retain their sharpness during operation. In some prior art devices (e.g., SST CMOS SuperFlash™ EEPROM Cell 300 shown in FIG. 3) the sharpness of the corner injector along the edge of the floating gate is inevitably rounded to some extent during manufacture (due to the polysilicon pad oxide removal and polysilicon sidewall oxidation process). The sharpness of sharp tip 920 and sharp tip 930 enable the memory cell 1300 of the present invention to carry out erase operations at lower voltages than less sharp prior art devices.

In addition, the methods for manufacturing the memory cell 1300 of the present invention are simple and reliable. In contrast, the methods for manufacturing prior art devices are very complicated. For example, in the SST CMOS SuperFlash™ EEPROM Cell 300 a rather complicated process is required to manufacture the tunneling injector 470 along the edge of the floating gate 330. In the manufacturing method for the memory cell 1300 of the present invention there is no significant process difficulty. This feature reduces manufacturing time and manufacturing cost.

It is understood that the manufacturing method of the memory cell 1300 of the invention described above with respect to FIGS. 5 through 12 sets forth one advantageous embodiment of the manufacturing method. It is understood that various changes and modifications may be made in the order of the manufacturing steps. For example, it is possible to create the structure of the first drain 710 and the structure of the second drain 720 by implanting the first drain 710 and the second drain 720 after the application of the second polysilicon layer that forms the control gate 1310. Implanting the first drain 710 and the second drain 720 after the application of the polysilicon layers is compatible with standard, low cost CMOS manufacturing processes.

Figure 20:
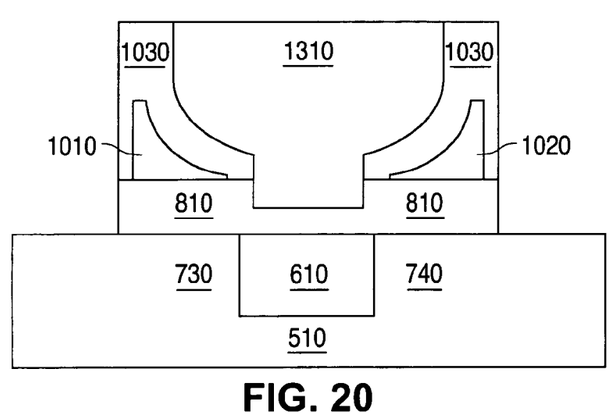
FIGS. 20 through 21 illustrate successive stages in the manufacture of a memory cell constructed in accordance with the principles of the present invention.

FIG. 20 shows the structure of the memory cell 1300 of the invention after the after the application of the second polysilicon layer that forms the control gate 1310 but before the implantation of the first drain 710 and the second drain 720. In this embodiment of the method of manufacture of the invention a mask and etch procedure is applied to etch away portions of the first oxide layer 1030 and the second oxide layer 810 over the substrate 510 where the first drain 710 and the second drain 720 will be located. The resulting structure is shown in FIG. 20.

Figure 21:
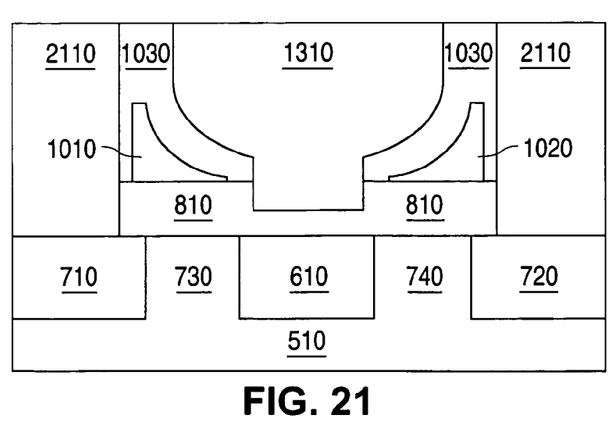

Then the first drain 710 and the second drain 720 are implanted. Then the first drain 710 and the second drain 720 are covered with a third layer of oxide 2110. This structure is shown in FIG. 21.

Figure 22:
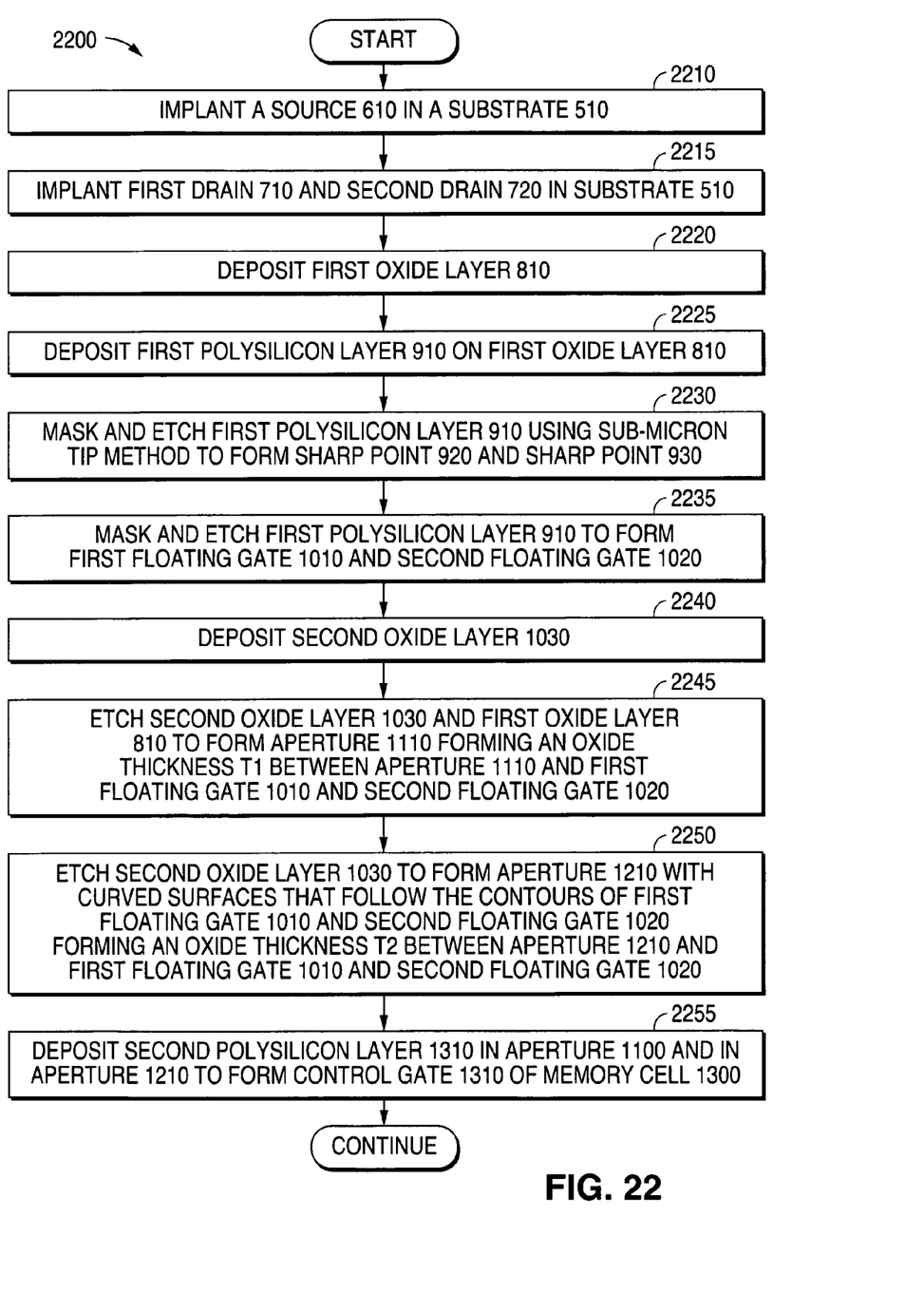
FIG. 22 illustrates a flowchart of an advantageous embodiment of a first method for manufacturing a memory cell of the present invention.

FIG. 22 illustrates a flowchart 2200 of an advantageous embodiment of a first method for manufacturing a memory cell 1300 of the present invention. In the first step of the first method a silicon substrate 510 is provided and a source 610 is implanted in the silicon substrate 510 (step 2210). Then a first drain 710 is implanted in the silicon substrate 510 on one side of the source 610 and a second drain 720 is implanted in the silicon substrate 510 on the other side of the source 610 (step 2215). A first channel 730 is located between the first drain 710 and the source 610 and a second channel 740 is located between the second drain 720 and the source 610.

Then a first oxide layer 810 is deposited over the first drain 710, the first channel 730, the source 610, the second channel 740, and the second drain 720 (step 2220). Then a first polysilicon layer 910 is deposited over the first oxide layer 810 (step 2225). Then the first polysilicon layer 910 is masked and etched using the Sub-Micron Tip Method to form a sharp point 920 and a sharp point 930 in the first polysilicon layer 910 (step 2230).

Then the first polysilicon layer 910 is masked and etched to form the first floating gate 1010 and the second floating gate 1020 (step 2235). Then a second oxide layer 1030 is deposited over the first floating gate 1010, and over the second floating gate 1020 and over the first oxide layer 810 (step 2240). Then the second oxide layer 1030 and the first oxide layer 810 are etched to form a first aperture 1100. The dimensions of the first aperture 1100 form an oxide thickness T1 between the first aperture 1100 and the first floating gate (and between the first aperture 1100 and the second floating gate (step 2245).

Then the second oxide layer 1030 is etched to form a second aperture 1210. Second aperture 1210 is formed with curved surfaces that follow the contours of the first floating gate 1010 and the second floating gate 1020. The dimensions of the second aperture 1210 form an oxide thickness T2 between the second aperture 1100 and the first floating gate (and between the second aperture 1100 and the second floating gate 1020) (step 2250).

Then a second polysilicon layer 1310 is deposited in the aperture 1100 and in the aperture 1210 to form the control gate 1310 of memory cell 1300 (step 2255). Control gate 1310 is located between first floating gate 1010 and second floating gate 1020 over common source 610.

Figure 23:
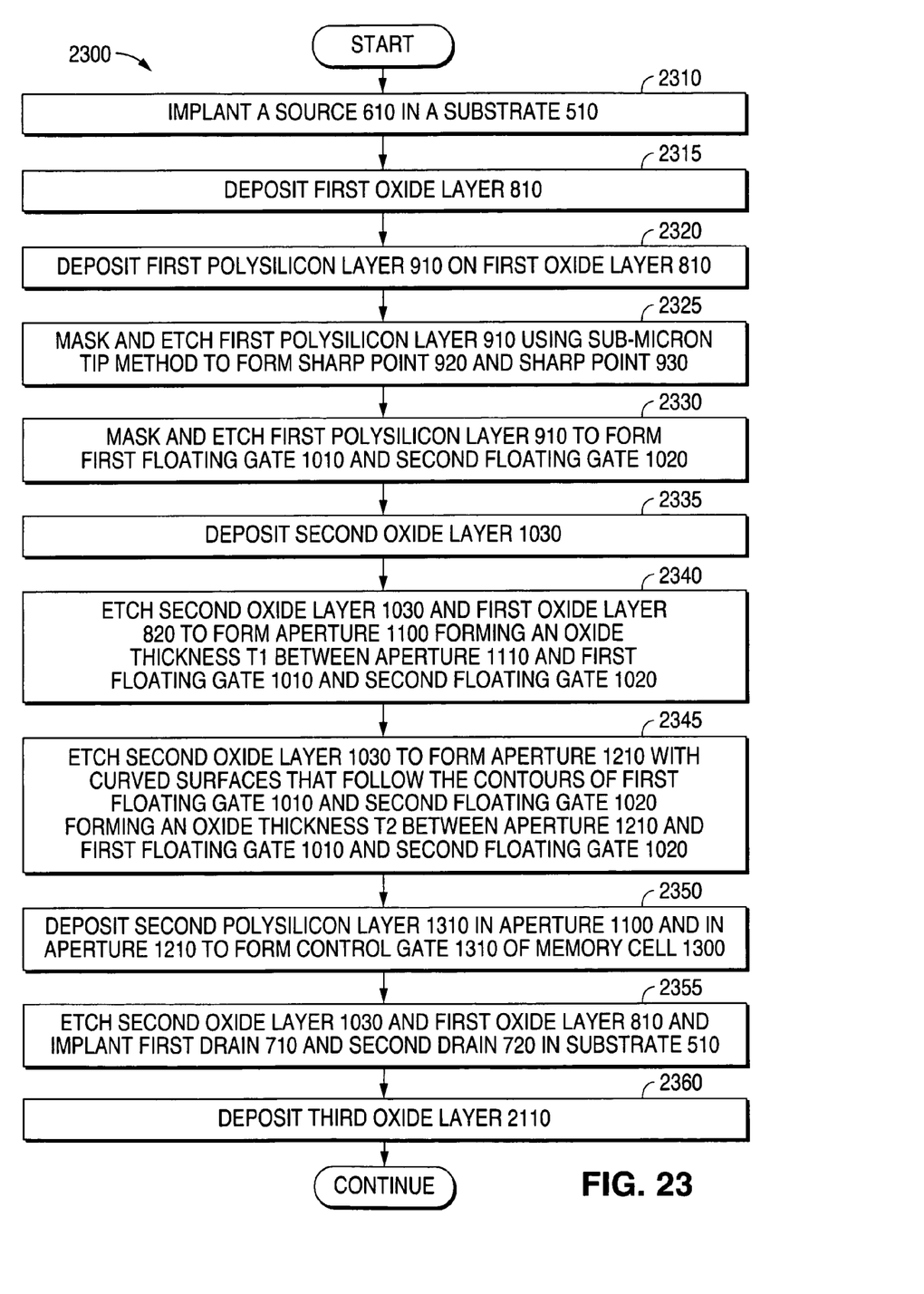
FIG. 23 illustrates a flowchart of an advantageous embodiment of a second method for manufacturing a memory cell of the present invention.

FIG. 23 illustrates a flowchart 2300 of an advantageous embodiment of a second method for manufacturing a memory cell 1300 of the present invention. In the first step of the second method a silicon substrate 510 is provided and a source 610 is implanted in the silicon substrate 510 (step 2310). Then a first oxide layer 810 is deposited over the source 610 and the silicon substrate 510 (step 2315). Then a first polysilicon layer 910 is deposited over the first oxide layer 810 (step 2320). Then the first polysilicon layer 910 is masked and etched using the Sub-Micron Tip Method to form a sharp point 920 and a sharp point 930 in the first polysilicon layer 910 (step 2325).

Then the first polysilicon layer 910 is masked and etched to form the first floating gate 1010 and the second floating gate 1020 (step 2330). Then a second oxide layer 1030 is deposited over the first floating gate 1010, and over the second floating gate 1020 and over the first oxide layer 810 (step 2335).

Then the second oxide layer 1030 and the first oxide layer 810 are etched to form a first aperture 1100. The dimensions of the first aperture 1100 form an oxide thickness T1 between the first aperture 1100 and the first floating gate (and between the first aperture 1100 and the second floating gate) (step 2340).

Then the second oxide layer 1030 is etched to form a second aperture 1210. Second aperture 1210 is formed with curved surfaces that follow the contours of the first floating gate 1010 and the second floating gate 1020. The dimensions of the second aperture 1210 form an oxide thickness T2 between the second aperture 1100 and the first floating gate (and between the second aperture 1100 and the second floating gate 1020) (step 2345).

Then a second polysilicon layer 1310 is deposited in the first aperture 1100 and in the second aperture 1210 to form the control gate 1310 of memory cell 1300 (step 2350). Control gate 1310 is located between first floating gate 1010 and second floating gate 1020 over common source 610.

Then portions of the second oxide layer 1030 and the first oxide layer 810 are etched away and a first drain 710 is implanted in the silicon substrate 510 on one side of the source 610 and a second drain 720 is implanted in the silicon substrate 510 on the other side of the source 610 (step 2355). A first channel 730 is located between the first drain 710 and the source 610 and a second channel 740 is located between the second drain 720 and the source 610. Then a third layer of oxide 2110 is deposited over the first drain 710 and over the second drain 720 (step 2360).

As previously described one of the advantages of the memory cell 1300 of the present invention is that it is capable of generating the same number of hot electrons using less voltage than prior art devices. Because memory cell 1300 of the present invention uses less voltage than prior art devices, memory cell 1300 requires less power to operate than prior art devices.

Another advantage of the memory cell 1300 of the present invention is the placement of the common source 610 between the sharp tip 920 of the first floating gate 1010 and the sharp tip 930 of the second floating gate 1020. Common source 610 is used as the common source for both bits ("Bit 1" and "Bit 2") of the memory cell 1300 of the invention. This arrangement simplifies the array design of the memory cells, reduces memory cell size and decreases manufacturing costs.

As previously mentioned, an important advantage of the method for manufacturing memory cell 1300 of the present invention is the ability to select separate values for the thickness T1 and the thickness T2.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A memory cell comprising:
a control gate overlying a source in a substrate and isolated from said source by a first oxide material; and
a floating gate adjacent to said control gate and isolated from said control gate by a second oxide material;
wherein:
said control gate comprises a convex region and a rectangular region extending from said convex region, said rectangular region comprising a vertical side; and
said floating gate comprises a horizontal bottom surface and a concave side having a contour that follows a contour of a surface of said convex region, where a junction of said horizontal bottom surface and said concave side forms a sharp tip oriented horizontally toward said vertical side of said rectangular region.

2. The method cell as set forth in claim 1, wherein:
a thickness of said second oxide material between said sharp tip of said floating gate and said first portion of said control gate is approximately one hundred fifty Ångstroms.

3. The memory cell as set forth in claim 1, wherein a thickness of said second oxide material between said surface of said convex region and said concave side is approximately three hundred Ångstroms.

4. The memory cell of claim 1, wherein each of the first and second oxide materials comprises a silicon oxide.

5. The memory cell of claim 1, wherein said sharp tip of said floating gate is configured to create an increased electric field strength that facilitates a discharge of electrons through said second oxide material into said vertical side of said rectangular region.

6. The memory cell of claim 1, wherein conformity of said surface of said convex region and said concave side of said floating gate increases a capacitor coupling between said control gate and said floating gate.

7. The memory cell of claim 1, further comprising a drain in said substrate and a channel between said source and said drain, wherein:
said floating gate overlies said channel; and
a location of said floating gate overlying said channel defines a first threshold voltage in a first portion of said channel adjacent to said source that is higher than a second threshold voltage in a second portion of said channel adjacent to said drain.

8. A memory cell comprising:
a control gate overlying a source in a substrate and isolated from said source by a first oxide material, the control gate comprising a convex region and a rectangular region extending from the convex region, the rectangular region comprising first and second vertical sides;
a first drain in said substrate and a first channel between said source and said first drain;
a second drain in said substrate and a second channel between said source and said second drain;
a first floating gate on a first side of said control gate and overlying said first channel and isolated from said control gate by a second oxide material; and a second floating gate on a second side of said control gate and overlying said second channel and isolated from said control gate by said second oxide material;

wherein said first floating gate comprises a first horizontal bottom surface and a first concave side having a contour that follows a contour of a first surface of said convex region, where a junction of said first horizontal bottom surface and said first concave side forms a first sharp tip, said first sharp tip oriented horizontally toward said first vertical side of said rectangular region; and wherein said second floating gate comprises a second horizontal bottom surface and a second concave side having a contour that follows a contour of a second surface of said convex region, where a junction of said second horizontal bottom surface and said second concave side forms a second sharp tip, said second sharp tip oriented horizontally toward said second vertical side of said rectangular region.

9. The memory cell as set forth in claim 8, wherein:
a thickness of said second oxide material between said first sharp tip and said first side of said control gate is approximately one hundred fifty Ångstroms; and
a thickness of said second oxide material between said second sharp tip and said second side of said control gate is approximately one hundred fifty Ångstroms.

10. The memory cell as set forth in claim 8, wherein:
said first sharp tip of said first floating gate is configured to create an increased electric field strength that facilitates a discharge of electrons through said second oxide material into said first side of said control gate; and
said second sharp tip of said second floating gate is configured to create an increased electric field strength that facilitates a discharge of electrons through said second oxide material into said second side of said control gate.

11. The memory cell as set forth in claim 8, wherein said memory cell is configured such that electrons on said first floating gate and electrons on said second floating gate are simultaneously discharged into said control gate by a control gate voltage on said control gate.

12. The memory cell as set forth in claim 8, wherein:
conformity of said first surface of said convex region of said control gate and said first concave side of said first floating gate increases a first capacitor coupling between said control gate and said first floating gate; and
confoll iity of said second surface of said convex region of said control gate and said second concave side of said second floating gate increases a second capacitor coupling between said control gate and said second floating gate.

13. The memory cell as set forth in claim 8, wherein:
a distance between said first surface of said convex region of said control gate and said first concave side of said first floating gate is approximately three hundred Ångstroms; and
a distance between said second surface of said convex region of said control gate and said second concave side of said second floating gate is approximately three hundred Ångstroms.

14. The memory cell as set forth in claim 8, wherein:
a location of said first floating gate overlying said first channel defines a first threshold voltage in a first portion of said first channel adjacent to said source that is higher than a second threshold voltage in a second portion of said first channel adjacent to said first drain; and
a location of said second floating gate overlying said second channel defines a third threshold voltage in a first portion of said second channel adjacent to said source that is higher than a fourth threshold voltage in a second portion of said second channel adjacent to said second drain.

15. The memory cell as set forth in claim 14, wherein:
said first and second threshold voltages in said first channel function as a first select transistor; and
said third and fourth threshold voltages in said second channel function as a second select transistor.

16. The memory cell of claim 8, wherein each of the first and second oxide materials comprises a silicon oxide.

17. An electrically erasable programmable read only memory comprising a memory cell array in which each memory cell in said memory cell array comprises:
a control gate overlying a source in a substrate and isolated from said source by a first oxide material, the control gate comprising a convex region and a rectangular region extending from the convex region, the rectangular region comprising first and second vertical sides;
a first drain in said substrate and a first channel between said source and said first drain;
a second drain in said substrate and a second channel between said source and said second drain;
a first floating gate on a first side of said control gate and overlying said first channel and isolated from said control gate by a second oxide material, wherein said control gate and said first floating gate are comprised within said memory cell; and
a second floating gate on a second side of said control gate and overlying said second channel and isolated from said control gate by said second oxide material;
wherein:
said first floating gate comprises a first horizontal bottom surface and a first concave side having a contour that follows a contour of a first surface of said convex region, where a junction of said first horizontal bottom surface and said first concave side forms a first sharp tip, said first sharp tip oriented horizontally toward said first vertical side of said rectangular region of said control gate; and
said second floating gate comprises a second horizontal bottom surface and a second concave side having a contour that follows a contour of a second surface of said convex region, where a junction of said second horizontal bottom surface and said second concave side forms a second sharp tip, said second sharp tip oriented horizontally toward said second vertical side of said rectangular region of said control gate.

18. The electrically erasable programmable read only memory as set forth in claim 17, wherein:
said first sharp tip of said first floating gate is configured to create an increased electric field strength that facilitates a discharge of electrons through said second oxide material into said first side of said control gate; and
said second sharp tip of said second floating gate is configured to create an increased electric field strength that facilitates a discharge of electrons through said second oxide material into said second side of said control gate.

19. The electrically erasable programmable read only memory as set forth in claim 17, wherein each of said memory cells is configured such that electrons on said first floating gate and electrons on said second floating gate of said memory cell are simultaneously discharged into said control gate of said memory cell by a control gate voltage on said control gate of said memory cell.

20. The electrically erasable programmable read only memory as set forth in claim 17, wherein:
- conformity of said first surface of said convex region of said control gate and said first concave side of said first floating gate increases a first capacitor coupling between said control gate and said first floating gate; and
- conformity of said second surface of said convex region of said control gate and said second concave side of said second floating gate increases a second capacitor coupling between said control gate and said second floating gate.

21. The electrically erasable programmable read only memory as set forth in claim 17, wherein:
- a location of said first floating gate overlying said first channel defines a first threshold voltage in a first portion of said first channel adjacent to said source that is higher than a second threshold voltage in a second portion of said first channel adjacent to said first drain;
- a location of said second floating gate overlying said second channel defines a third threshold voltage in a first portion of said second channel adjacent to said source that is higher than a fourth threshold voltage in a second portion of said second channel adjacent to said second drain;
- said first and second threshold voltages in said first channel function as a first select transistor; and
- said third and fourth threshold voltages in said second channel function as a second select transistor.

22. The electrically erasable programmable read only memory of claim 17, wherein each of the first and second oxide materials comprises a silicon oxide.

* * * * *